(12) United States Patent
Lee et al.

(10) Patent No.: US 12,532,579 B2
(45) Date of Patent: Jan. 20, 2026

(54) LIGHT EMITTING ELEMENT, MANUFACTURING METHOD OF LIGHT EMITTING ELEMENT, AND DISPLAY DEVICE INCLUDING LIGHT EMITTING ELEMENT

(71) Applicant: Samsung Display Co., LTD., Yongin-si (KR)

(72) Inventors: Seung A Lee, Yongin-si (KR); Hoo Keun Park, Yongin-si (KR); Young Jin Song, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1026 days.

(21) Appl. No.: 17/543,297

(22) Filed: Dec. 6, 2021

(65) Prior Publication Data

US 2022/0285582 A1    Sep. 8, 2022

(30) Foreign Application Priority Data

Mar. 4, 2021    (KR) ......................... 10-2021-0028940

(51) Int. Cl.
*H10H 20/824*    (2025.01)
*H10H 20/01*    (2025.01)
(Continued)

(52) U.S. Cl.
CPC ........ *H10H 20/824* (2025.01); *H10H 20/013* (2025.01); *H10H 20/818* (2025.01); *H01L 25/0753* (2013.01)

(58) Field of Classification Search
CPC ..... H01L 33/30; H01L 33/00; H01L 33/0062; H01L 33/18; H10H 20/824; H10H 20/013; H10H 20/818; H10H 20/812
See application file for complete search history.

(56) References Cited

U.S. PATENT DOCUMENTS 9,029,875 B2    5/2015    Na et al.
10,199,534 B2    2/2019    Kang
(Continued)

FOREIGN PATENT DOCUMENTS

CN    102122688 A    7/2011
CN    102709417 A    10/2012
(Continued)

OTHER PUBLICATIONS

International Search Report issued on Jan. 25, 2022, in corresponding International Application No. PCT/KR2021/014731 (3 pages).
(Continued)

*Primary Examiner* — Matthew C Landau
*Assistant Examiner* — Halee Cramer
(74) *Attorney, Agent, or Firm* — Womble Bond Dickinson (US) LLP

(57)    ABSTRACT

A light emitting element includes: a first semiconductor layer including a semiconductor of a first type; a second semiconductor layer including a semiconductor of a second type different from the first type; and an active layer between the first and second semiconductor layers, the active layer including a first active area including a first well layer, and a second active area including a second well layer. The first well layer has a first band gap, and the second well layer has a second band gap smaller than the first band gap. At least a portion of the first active area is between the second active area and the second semiconductor layer. A distance between the second active area and the second semiconductor layer is equal to or greater than 0.1 times of a distance between the first and second semiconductor layers.

16 Claims, 15 Drawing Sheets

(51) Int. Cl.
*H10H 20/818* (2025.01)
*H01L 25/075* (2006.01)

(56) References Cited

U.S. PATENT DOCUMENTS

| | | | | |
|---|---|---|---|---|
| 2011/0187294 A1* | 8/2011 | Bergmann | ............ | H10H 20/811 |
| | | | | 315/363 |
| 2012/0080660 A1* | 4/2012 | Jung | ......................... | F21K 9/23 |
| | | | | 257/E33.066 |
| 2012/0241770 A1* | 9/2012 | Na | ....................... | H10H 20/812 |
| | | | | 257/86 |
| 2017/0229609 A1 | 8/2017 | Michiue | | |
| 2021/0249841 A1* | 8/2021 | Aoki | .................. | H01S 5/34333 |

FOREIGN PATENT DOCUMENTS

| | | |
|---|---|---|
| KR | 10-2013-0089343 A | 8/2013 |
| KR | 10-2014-0046163 A | 4/2014 |
| KR | 10-2016-0013552 A | 2/2016 |
| KR | 10-2016-0109331 A | 9/2016 |
| KR | 10-2020-0088934 A | 7/2020 |
| WO | WO 2020-054938 A1 | 3/2020 |
| WO | WO 2020-171322 A1 | 8/2020 |

OTHER PUBLICATIONS

Taiwanese Office Action issued Apr. 30, 2025, in corresponding Taiwanese Patent Application No. 110143021 (8 pages).

\* cited by examiner

LIGHT EMITTING ELEMENT, MANUFACTURING METHOD OF LIGHT EMITTING ELEMENT, AND DISPLAY DEVICE INCLUDING LIGHT EMITTING ELEMENT

CROSS-REFERENCE TO RELATED APPLICATION

The application claims priority to and the benefit of Korean patent application 10-2021-0028940 filed on Mar. 4, 2021 in the Korean Intellectual Property Office, the entire content of which is incorporated herein by reference.

BACKGROUND

1. Field

One or more embodiments of the present disclosure generally relate to a light emitting element, a manufacturing method of a light emitting element, and a display device including a light emitting element.

2. Description of Related Art

Recently, as interest in information displays is increased, research and development of display devices have been continuously conducted.

SUMMARY

Embodiments of the present disclosure are directed toward a light emitting element, a manufacturing method of a light emitting element, and a display device including a light emitting element, which can prevent or reduce the distortion of light information emitted from the light emitting element.

Embodiments of the present disclosure are also directed toward a light emitting element, a manufacturing method of a light emitting element, and a display device including a light emitting element, which can reduce influence on an active area of the light emitting element, while an etching process is performed.

In accordance with one or more embodiments of the present disclosure, there is provided a light emitting element including: a first semiconductor layer including a semiconductor of a first type; a second semiconductor layer including a semiconductor of a second type different from the first type; and an active layer between the first semiconductor layer and the second semiconductor layer, the active layer including a first active area including a first well layer, and a second active area including a second well layer, wherein the first well layer has a first band gap, and the second well layer has a second band gap smaller than the first band gap, wherein at least a portion of the first active area is between the second active area and the second semiconductor layer, and wherein a distance between the second active area and the second semiconductor layer is equal to or greater than 0.1 times of a distance between the first semiconductor layer and the second semiconductor layer.

Light having a first wavelength may be emitted in the first active area, and light having a second wavelength greater than the first wavelength may be emitted in the second active area.

The second active area may be spaced apart from the first semiconductor layer at a first distance, and may be spaced apart from the second semiconductor layer at a second distance. The second distance may be smaller than the first distance.

The second distance may be 0.2 times to 0.25 times of the distance between the first semiconductor layer and the second semiconductor layer.

The first distance may be equal to or greater than 0.2 times of the distance between the first semiconductor layer and the second semiconductor layer.

A ratio of the second distance to the first distance may be 0.55 to 1.

A ratio of the second distance to the first distance may be 0.8 to 1.25.

The active layer may include a band-gap-determining material. An atomic ratio of the band-gap-determining material in the first active area may be equal to or greater than a first atomic ratio, and an atomic ratio of the band-gap-determining material in the second active area may be equal to or greater than a second atomic ratio, the second atomic ratio being greater than the first atomic ratio.

The second atomic ratio may be equal to or greater than 10%.

The first active area may include a (1-1)th active area and a (1-2)th active area. The (1-1)th active area may be between the first semiconductor layer and the second active area, and the (1-2)th active area may be between the second semiconductor layer and the second active area.

An atomic ratio of the band-gap-determining material in the (1-1)th active area may be equal to or greater than the second atomic ratio.

The band-gap-determining material may include indium (In).

In accordance with one or more embodiments of the present disclosure, there is provided a method of manufacturing a light emitting element, the method including: providing, on a stack substrate, a first semiconductor layer including a semiconductor of a first type; providing an active layer on the first semiconductor layer; and providing, on the active layer, a second semiconductor layer including a semiconductor of a second type different from the first type, wherein the providing of the active layer includes: providing a first well layer; and providing a second well layer, at least a portion of the first well layer being between the second well layer and the second semiconductor layer, wherein an energy band gap of the second well layer is smaller than an energy band gap of the first well layer, wherein the active layer includes a first active area including the first well layer, and a second active area including the second well layer, and wherein a distance between the second active area and the second semiconductor layer is equal to or greater than 0.1 times of a distance between the first semiconductor layer and the second semiconductor layer.

Light having a first wavelength may be emitted in the first active area, and light having a second wavelength greater than the first wavelength may be emitted in the second active area.

The method may further include etching the first semiconductor layer, the active layer, and the second semiconductor layer. The providing of the first well layer may further include: providing a (1-1)th well layer on the first semiconductor layer; and providing a (1-2)th well layer on the second well layer. The second well layer may be between the (1-1)th well layer and the (1-2)th well layer. The etching may be performed after the providing of the (1-2)th well layer.

The etching may be performed in a direction toward the (1-1)th well layer from the (1-2)th well layer.

The second active area may be spaced apart from the first semiconductor layer at a first distance, and may be spaced apart from the second semiconductor layer at a second distance. The second distance may be smaller than the first distance.

The second distance may be 0.2 times to 0.25 times of the distance between the first semiconductor layer and the second semiconductor layer.

The first distance may be equal to or greater than 0.2 times of the distance between the first semiconductor layer and the second semiconductor layer.

The active layer may include a band-gap-determining material. An atomic ratio of the band-gap-determining material in the first active area may be smaller than an atomic ratio of the band-gap-determining material in the second active area.

In accordance with one or more embodiments of the present disclosure, there is provided a display device including the light emitting element.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
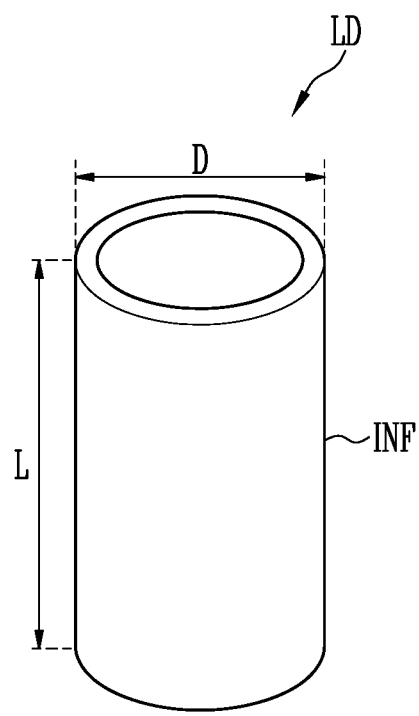
FIGS. 1 and 2 are perspective and cross-sectional views, respectively, illustrating a light emitting element in accordance with one or more embodiments of the present disclosure.

Some embodiments disclosed in the present specification are provided only for illustrative purposes and for full understanding of the scope of the present disclosure by those skilled in the art. However, the present disclosure is not limited to the described embodiments, and it should be understood that the present disclosure includes all suitable modification examples or change examples without departing from the spirit and scope of the present disclosure.

The terms used in the specification have been selected as general terms to be used considering the functions in the present disclosure, but they may depend on the intentions of those skilled in the art, practice, the appearance of new technologies, etc. In addition, specific embodiments use the terms selected arbitrarily by the applicant and in these cases, their meaning will be described when describing corresponding disclosures. Thus, it should be noted that the terms used in the specification should be construed on the basis of their actual meanings and contents through the specification, not just names thereof.

The drawings attached to the present specification are provided to easily explain the present disclosure, and the shapes shown in the drawings may be exaggerated and displayed as necessary to help understanding of the present disclosure, and thus the present disclosure is not limited to the drawings.

In the present specification, when it is determined that a detailed description of a configuration or function related to the present disclosure that should be known or apparent to those of ordinary skill in the art may obscure the gist of the present disclosure, a detailed description thereof will not be provided.

It will be understood that, although the terms first, second, etc. may be used herein to describe various elements, these elements should not be limited by these terms. These terms are only used to distinguish one element from another element. Thus, a first element could be termed a second element without departing from the teachings of the present invention. Similarly, a second element could be termed a first element. As used herein, the singular forms are intended to include the plural forms as well, unless the context clearly indicates otherwise.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

As used herein, expressions such as "at least one of", "one of", and "selected from", when preceding a list of elements, modify the entire list of elements and do not modify the individual elements of the list. The term "and/or" includes any and all combinations of one or more of the associated listed items. Further, the use of "may" when describing embodiments of the present disclosure refers to "one or more embodiments of the present disclosure".

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The present disclosure relates to a light emitting element, a manufacturing method of a light emitting element, and a display device including a light emitting element. Hereinafter, a light emitting element, a manufacturing method of a light emitting element, and a display device including a light emitting element in accordance with one or more embodiments of the present disclosure will be described with reference to FIGS. 1 to 14.

Figure 2:
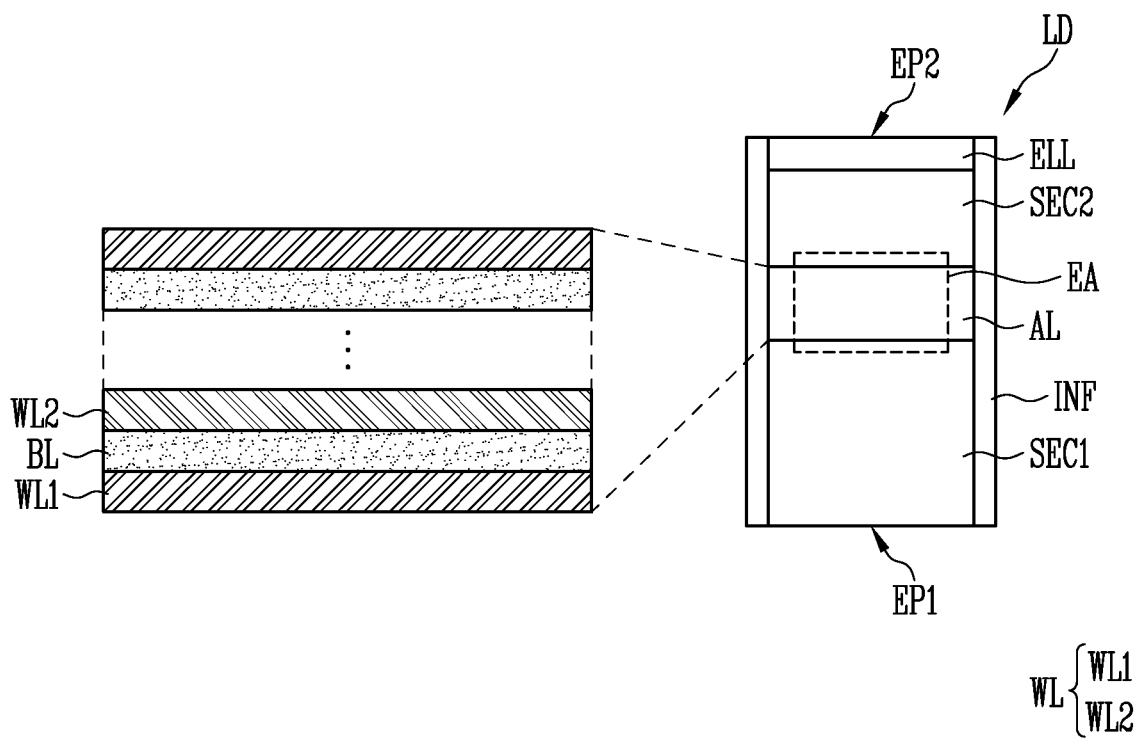

A light emitting element LD included in a display device in accordance with one or more embodiments of the present disclosure is illustrated in FIGS. 1 and 2. FIGS. 1 and 2 are perspective and cross-sectional views, respectively, illustrating a light emitting element in accordance with one or more embodiments of the present disclosure. Although a pillar-shaped light emitting element LD is illustrated in FIGS. 1 and 2, the kind and/or shape of the light emitting element LD are/is not limited thereto.

Referring to FIGS. 1 and 2, the light emitting element LD includes a first semiconductor layer SEC1, a second semiconductor layer SEC2, and an active layer AL interposed between the first semiconductor layer SEC1 and the second semiconductor layer SEC2. For example, when assuming that an extending direction of the light emitting element LD is a length L direction, the light emitting element LD may include the first semiconductor layer SEC1, the active layer AL, and the second semiconductor layer SEC2, which are sequentially stacked along the length L direction.

The light emitting element LD may be provided in a pillar shape extending along one direction. The light emitting element LD may have a first end portion EP1 and a second end portion EP2. One of the first and second semiconductor layers SEC1 and SEC2 may be adjacent to the first end portion EP1 of the light emitting element LD. The other of the first and second semiconductor layers SEC1 and SEC2 may be adjacent to the second end portion EP2 of the light emitting element LD.

The light emitting element LD may be a light emitting element manufactured in a pillar shape through an etching process, etc. The term "pillar shape" may include a rod-like shape and/or bar-like shape, which is elongated in the length L direction (e.g., its aspect ratio is greater than 1), such as a cylinder and/or a polyprism, and the shape of its cross-section is not particularly limited. For example, a length L of the light emitting element LD may be greater than a diameter D (or a width of a cross-section) of the light emitting element LD.

The light emitting element LD may have a size of nanometer scale to micrometer scale. In one or more embodiments, the light emitting element LD may have a diameter D (or width) in a range of nanometer scale to micrometer scale and/or a length L in a range of nanometer scale to micrometer scale. However, the size of the light emitting element LD is not limited thereto. The size of the light emitting element LD may be variously suitably changed according to design conditions of various suitable types (or kinds) of devices, e.g., a display device, and/or the like, which use, as a light source, a light emitting device using the light emitting element LD.

The first semiconductor layer SEC1 may be a first conductivity type semiconductor layer. For example, the first semiconductor layer SEC1 may include an N-type semiconductor layer. In one or more embodiments, the first semiconductor layer SEC1 may include any one semiconductor material selected from among InAlGaN, GaN, AlGaN, InGaN, AlN, and InN, and may include an N-type semiconductor layer doped with a first conductivity type dopant such as Si, Ge and/or Sn. However, the material constituting the first semiconductor layer SEC1 is not limited thereto. In one or more embodiments, the first semiconductor layer SEC1 may be configured with various suitable materials.

The active layer AL may be on the first semiconductor layer SEC1. The active layer AL may be between the first semiconductor layer SEC1 and the second semiconductor layer SEC2.

The active layer AL may include any one of AlGaInP, AlGaP, AlInGaN, InGaN, and/or AlGaN. For example, when the active layer AL is to output red light, the active layer AL may include AlGaInP and/or InGaN. When the active layer AL is to output green light or blue light, the active layer AL may include InGaN. However, the present disclosure is not limited to the above-described examples.

The active layer AL may be formed in a single-quantum well structure or a multi-quantum well structure. Hereinafter, a case where the active layer AL has a multi-quantum well structure will be mainly described.

The active layer AL may include a well layer WL and a barrier layer BL. An energy band gap defined in the well layer WL may be smaller than that defined in the barrier layer BL.

The active layer AL may have a structure in which the well layer and the barrier layer BL are alternately arranged. For example, any one of the well layers WL may be adjacent to the first semiconductor layer SEC1, and another of the well layers WL may be adjacent to the second semiconductor layer SEC2, and the barrier layer BL may be between a plurality of well layers WL. A more detailed structure of the active layer AL will be further described herein below with reference to FIGS. 3 to 5.

The second semiconductor layer SEC2 is formed on the active layer AL, and may include a semiconductor layer having a type different from that of the first semiconductor layer SEC1. For example, the second semiconductor layer SEC2 may include a P-type semiconductor layer. In one or more embodiments, the second semiconductor layer SEC2 may include at least one semiconductor material selected from among InAlGaN, GaN, AlGaN, InGaN, AlN, and InN, and may include a P-type semiconductor layer doped with a second conductivity type dopant such as Mg. However, the material constituting the second semiconductor layer SEC2 is not limited thereto. In one or more embodiments, the second semiconductor layer SEC2 may be configured with various suitable materials.

An electrode layer ELL may be formed on the second semiconductor layer SEC2. The electrode layer ELL may include a metal or a metal oxide. In one or more embodiments, the electrode layer ELL may include at least one of Cr, Ti, Al, Au, Ni, ITO, IZO, ITZO, an oxide thereof, or an alloy thereof.

When a voltage which is a threshold voltage or more is applied to both ends of the light emitting element LD, electron-hole pairs are combined in the active layer AL, and the light emitting element LD emits light. For example, combination between electrons and holes occurs in the well layer WL of the active layer AL, and energy emitted according to the combination may be provided (e.g., output) as light. The light emission of the light emitting element LD is controlled by using such a principle, so that the light emitting element LD can be used as a light source for various suitable light emitting devices, including a pixel of a display device.

In some embodiments, the light emitting element LD may further include an insulative film INF provided on a surface thereof. The insulative film INF may be formed on the surface of the light emitting element LD to surround an outer side surface of at least the active layer AL. In addition, the insulative film INF may further surround one area of each of the first and second semiconductor layers SEC1 and SEC2.

The insulative film INF may be configured with a single film or a plurality of films. For example, the insulative film INF may include a first insulative film including a first material and a second insulative film including a second material different from the first material.

The insulative film INF may expose both end portions of the light emitting element LD, which have different polarities. For example, the insulative film INF may expose the electrode layer ELL adjacent to the second end portion EP2 of the light emitting element LD and the first semiconductor layer SEC1 adjacent to the first end portion EP1 of the light emitting element LD. In some embodiments, the insulative film INF may expose a side portion of each of the first semiconductor layer SEC1 and the second semiconductor layer SEC2.

The insulative film INF may include any one of silicon oxide (SiOx), silicon nitride (SiNx), silicon oxynitride (SiON), aluminum oxide (AlOx), and/or titanium oxide (TiOx).

The insulative layer INF can prevent or reduce the risk of an electrical short-circuit which may occur when the active layer AL is in contact with a conductive material other than the first semiconductor layer SEC1 and the second semiconductor layer SEC2. The insulative layer INF can minimize or reduce a surface defect of the light emitting element LD, thereby improving the lifetime and efficiency of the light emitting element LD. When a plurality of light emitting elements LD are provided adjacent to each other, the insulative film INF can prevent or reduce the risk of a short-circuit which may occur between the light emitting elements LD.

A light emitting device including the above-described light emitting element LD may be used in various suitable kinds of devices which require a light source, including a display device. For example, a plurality of light emitting elements LD may be provided in each pixel (see e.g., 'PXL' shown in FIG. 14) of a display panel (see e.g., "PNL' shown in FIG. 14), and may be used as a light source of each pixel. However, the application field of the light emitting element LD is not limited to the above-described example. For example, the light emitting element LD may be used in other suitable devices that require a light source, such as a lighting device.

Hereinafter, the active layer AL included in the light emitting element LD in accordance with the embodiments of the present disclosure will be described in more detail with reference to FIGS. 3 to 5.

Figure 3:
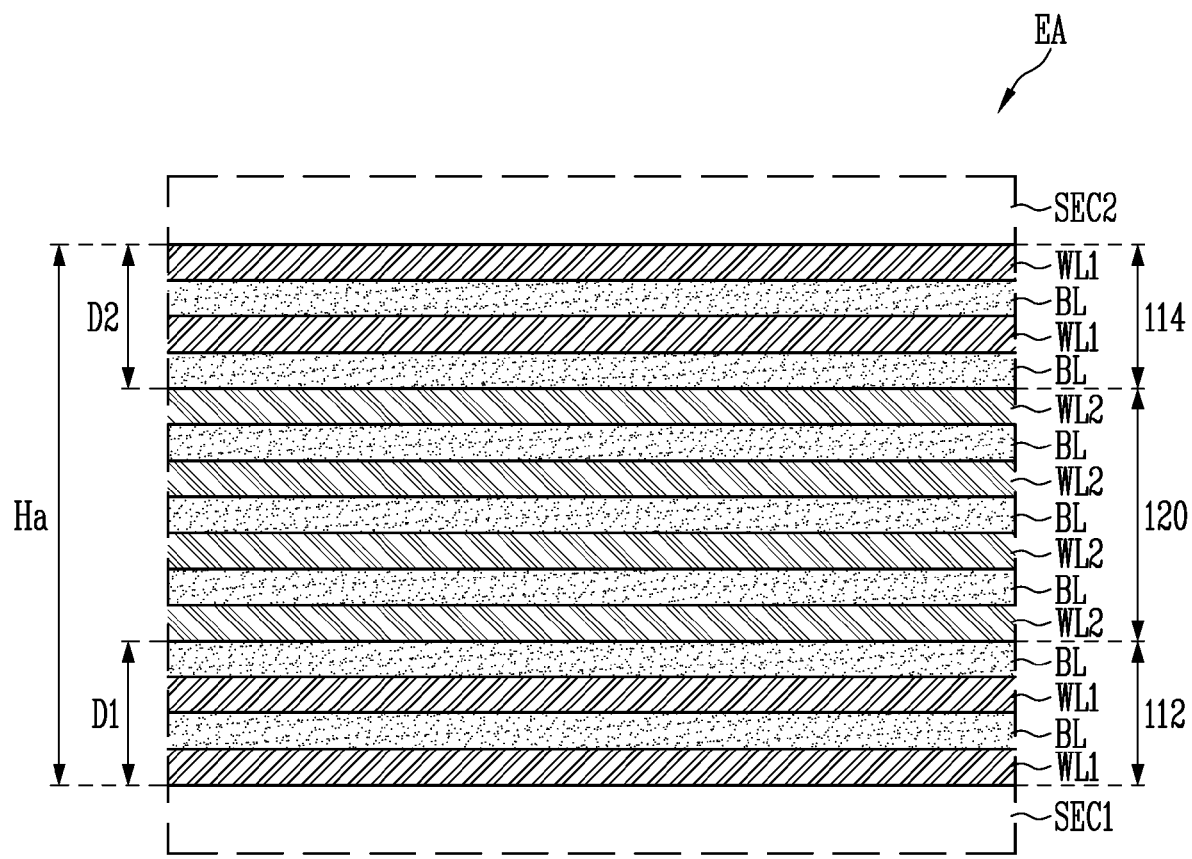
FIG. 3 is an enlarged view of area EA shown in FIG. 2.

FIG. 3 is an enlarged view of area EA shown in FIG. 2. FIG. 3 may be a view illustrating a multi-quantum well structure of the active layer AL.

Figure 4:
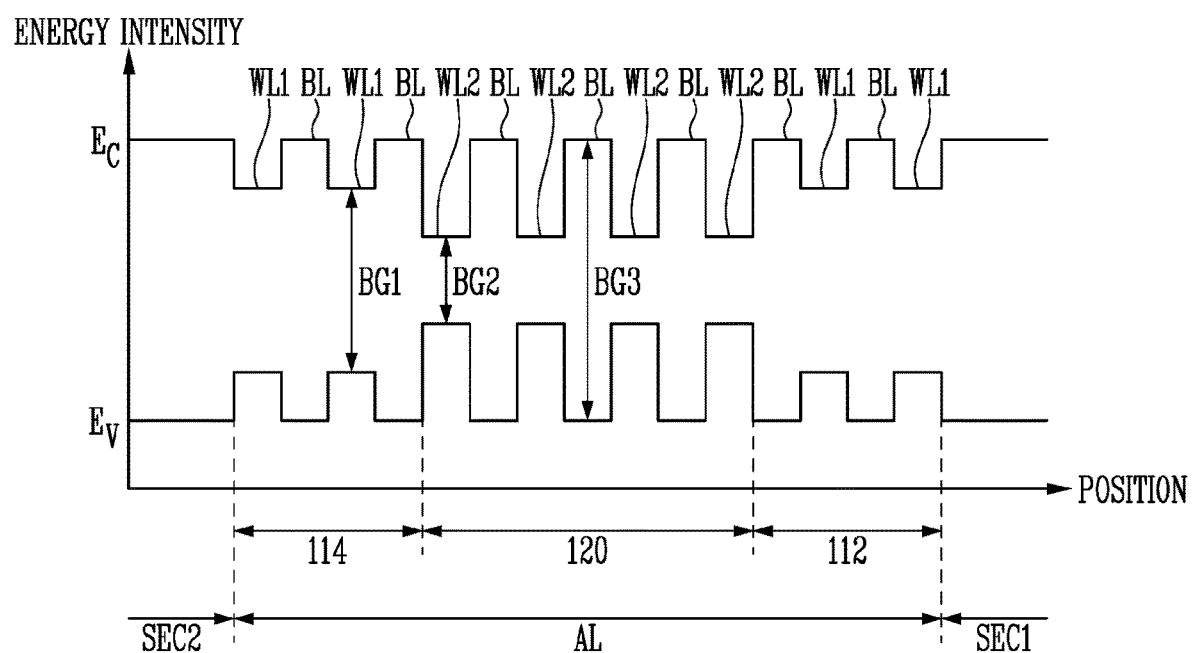
FIG. 4 is a graph illustrating energy intensity for each position of the light emitting element in accordance with one or more embodiments of the present disclosure.

FIG. 4 is a graph illustrating energy intensity for each position of the light emitting element in accordance with one or more embodiments of the present disclosure. FIG. 4 is a band diagram for each position of the light emitting element LD. In FIG. 4, energy intensity for each position of the active layer AL is mainly illustrated, and energy intensity for each position of a portion of each of the first semiconductor layer SEC1 and the second semiconductor layer SEC2, which are adjacent to the active layer AL.

Figure 5:
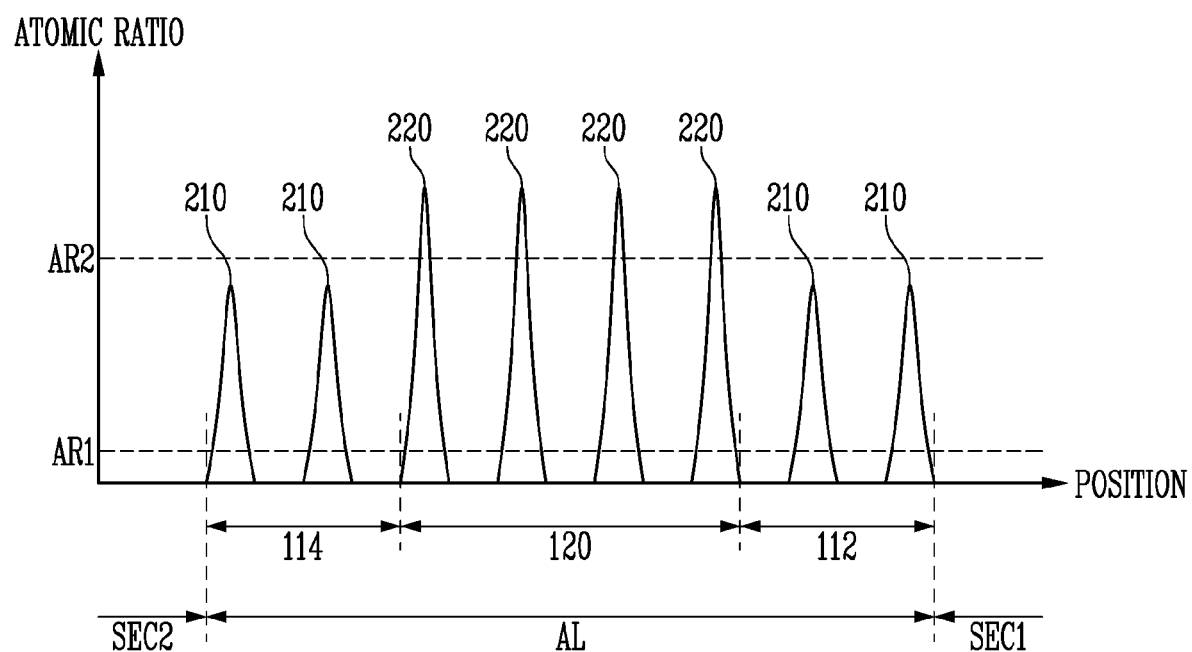
FIG. 5 is a graph illustrating atomic ratio of a band-gap-determining material for each position of the light emitting element in accordance with one or more embodiments of the present disclosure.

FIG. 5 is a graph illustrating atomic ratio of a band-gap-determining material for each position of the light emitting element in accordance with one or more embodiments of the present disclosure. In FIG. 5, atomic ratio of a band-gap-determining material with respect to the active layer AL is illustrated.

Ec shown in FIG. 4 means bottom energy of a conduction band, and Ev means highest energy of a valence band. A band gap, as defined in this specification, means an energy band which separates the conduction band and the valence band from each other.

The first semiconductor layer SEC1 and the second semiconductor layer SEC2 may have a set or predetermined band gap. The set or predetermined band gap has a value of Ec-Ev, and may be greater than a first band gap BG1 and a second band gap BG2, which refer to band gaps in the well layer WL.

The well layer WL included in the active layer AL may be positioned between adjacent barrier layers BL. In some embodiments, the well layer WL most adjacent to the first semiconductor layer SEC1 may be between the barrier layer BL and the first semiconductor layer SEC1. The well layer WL most adjacent to the second semiconductor layer SEC2 may be between the barrier layer BL and the second semiconductor layer SEC2.

Each of an energy band gap of the well layer WL and an energy band gap of the barrier layer BL may be defined by an amount (e.g., an atomic ratio) of a band-gap-determining material included therein. The band-gap-determining material, as defined in this specification, may mean a material in which an energy band gap of each layer is changed, when an amount (e.g., an atomic ratio) included in each layer is changed.

In accordance with one or more embodiments, the energy band gap may decrease as the band-gap-determining material included in the active layer AL increases. For example, when the active layer AL includes InGaN, the band-gap-determining material of each of the well layer WL and the barrier layer BL may be In. As compared with the barrier layer BL, In having a high concentration may be included in the well layer WL.

In accordance with one or more embodiments, the energy band gap may be further decreased with respect to some well layers WL in the active layer AL so as to improve the light emission efficiency of the light emitting element LD by facilitating combination between hole-electrons pairs.

In accordance with one or more embodiments, the well layer WL may include a first well layer WL1 and a second well layer WL2. An energy band gap in the second well layer WL2 may be smaller than that in the first well layer WL1. In accordance with one or more embodiments, a wavelength of light emitted in the first well layer WL1 may be smaller than that of light emitted in the second well layer WL2.

The active layer AL may include a first active area 110 and a second active area 120. The first active area 110 may be defined as an area in which the first well layer WL1 is included. The second active area 120 in which the second well layer WL2 is included may be designated as a main light emitting area.

In accordance with one or more embodiments, at least a portion of a first graph 210 (see FIG. 5) may have a value which is greater than a first atomic ratio AR1 and is smaller than a second atomic ratio AR2. The first active area 110 may include an area of the active layer AL, which corresponds to the at least a portion of the first graph 210.

In accordance with one or more embodiments, at least a portion of a second graph 220 may have a value greater than the second atomic ratio AR2, and the second active area 120 may include an area of the active layer AL, which corresponds to the at least a portion of the second graph 220.

The second well layer WL2 may not be provided in the first active area 110. In accordance with one or more embodiments, at least a portion of the first active area 110 may be between the second active area 120 and the second semiconductor layer SEC2. The first active area 110 may include a (1-1)th active area 112 and a (1-2)th active area 114. The (1-1)th active area 112 may mean an area in the active layer AL, which is adjacent to the first semiconductor layer SEC1. The (1-2)th active area 114 may mean an area in the active layer AL, which is adjacent to the second semiconductor layer SEC2.

The second active area 120 may be defined as an area in which the second well layer WL2 is located. The first well layer WL1 may not be in the second active area 120. The second active area 120 may be between the (1-1)th active area 112 and the (1-2)th active area 114.

In accordance with one or more embodiments, the second active area 120 may be spaced apart from the first semiconductor layer SEC1 and the second semiconductor layer SEC2. Accordingly, damage to the second well layer WL2 in a manufacturing process of the light emitting element LD can be prevented or reduced. This will be described in more detail herein below with reference to FIG. 9.

The second active area 120 may be spaced apart from the first semiconductor layer SEC1 at a first distance D1, and be spaced apart from the second semiconductor layer SEC2 at a second distance D2.

Any one of the second well layers WL2, which is most adjacent to the first semiconductor layer SEC1, may be spaced apart from the first semiconductor layer SEC1 at the first distance D1.

Any one of the second well layers WL2, which is most adjacent to the second semiconductor layer SEC2, may be spaced apart from the second semiconductor layer SEC2 at the second distance D2.

The first distance D1 may mean a shortest distance between the second active area 120 and the first semiconductor layer SEC1. The first distance D1 may mean a shortest distance between the second well layer WL2 most adjacent to the first semiconductor layer SEC1 and the first semiconductor layer SEC1.

The second distance D2 may mean a shortest distance between the second active area 120 and the second semiconductor layer SEC2. The second distance D2 may mean a shortest distance between the well layer WL2 most adjacent to the second semiconductor layer SEC2 and the second semiconductor layer SEC2.

The first distance D1 may be equal to or greater than 0.1 times (e.g., $1/10^{th}$ of) a height Ha of the active layer AL. The first distance D1 may be equal to or greater than 0.2 times the height Ha of the active layer AL. The first distance D1 may be 0.2 times to 0.35 times the height Ha of the active layer AL. The height Ha of the active layer AL may mean a distance between the first semiconductor layer SEC1 and the second semiconductor layer SEC2.

The second distance D2 may be equal to or greater than 0.1 times the height Ha of the active layer AL. The second distance D2 may be equal to or greater than 0.2 times the height Ha of the active layer AL. The second distance D2 may be 0.2 times to 0.25 times the height Ha of the active layer AL. The second distance D2 may be equal to or greater than 0.25 times the height Ha of the active layer AL.

In accordance with one or more embodiments, the ratio of the second distance D2 to the first distance D1 may be 0.55 to 1. In accordance with one or more other embodiments, the ratio of the second distance D2 to the first distance D1 may be 0.8 to 1.25.

Figure 9:
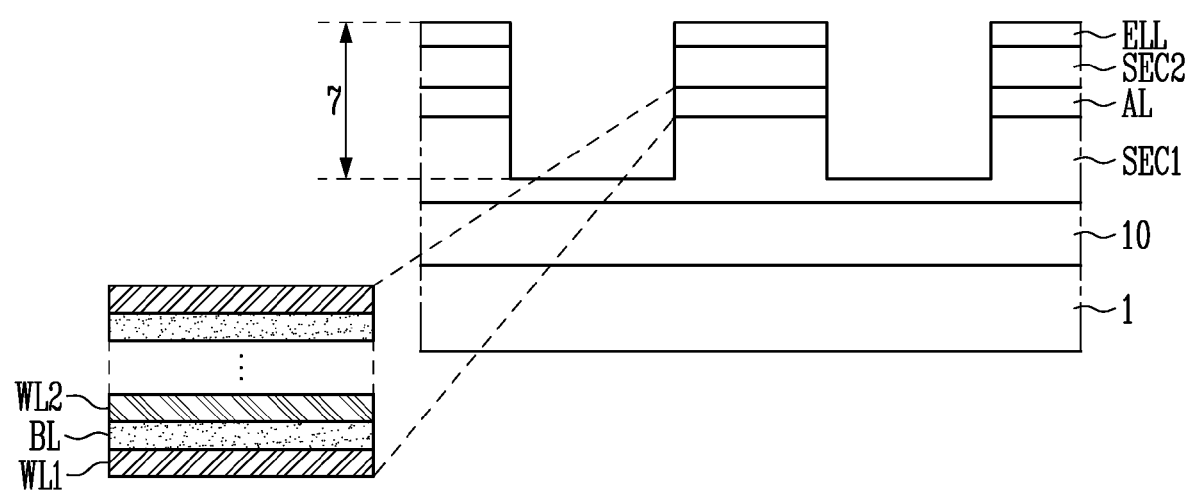

In accordance with one or more embodiments, influence on the second well layer WL2 may be decreased during an etching process for forming a light emitting stack pattern (see e.g., element '7' shown in FIG. 9). This will be described in further detail herein below.

The first well layer WL1 may be in the first active area 110. The first well layer WL1 may have an energy band gap smaller than that of the barrier layer BL. The first band gap BG1 may be provided in the first well layer WL1. The first band gap BG1 may mean an energy band gap in the first well layer WL1.

The second well layer WL2 may be in the second active area 120. The second band gap BG2 may be provided in the second well layer WL2. The second band gap BG2 may mean an energy band gap in the second well layer WL2. The second band gap BG2 may be smaller than the first band gap BG1.

The barrier layer BL may be included in the active layer AL, to define the well layer WL. The barrier layer BL may have a third band gap BG3. The third band gap BG3 may be greater than each of the first band gap BG1 and the second band gap BG2. For example, the barrier layer BL may have an energy band gap greater than the first band gap BG1 and the second band gap BG2, and accordingly, a well layer WL having a relatively low energy band gap is defined between adjacent barrier layers BL.

The barrier layer BL may have an energy band gap equal to that of the first semiconductor layer SEC1 and the second semiconductor layer SEC2. However, in some embodiments, the barrier layer BL may have an energy band gap smaller than that of the first semiconductor layer SEC1 and the second semiconductor layer SEC2.

The first band gap BG1 may be determined by a concentration of a band-gap-determining material included in the first well layer WL1. The second band gap BG2 may be determined by a concentration of a band-gap-determining material included in the second well layer WL2.

For example, when the active layer AL includes any one of AlGaInP and/or InGaN, the band-gap-determining material of the first well layer WL1 and the second well layer WL2 may be In.

Hereinafter, energy band gap according to amount of the band-gap-determining material will be described with reference to FIG. 5 in conjunction with FIG. 4. In one or more embodiments, atomic ratio in the amount of the band gap material will be mainly described.

The first graph 210 is a graph illustrating atomic ratio of the band-gap-determining material included in the first well layer WL1. The second graph 220 is a graph illustrating atomic ratio of the band-gap-determining material included in the second well layer WL2.

A peak of the first graph 210 may be greater than the first atomic ratio AR1 and is smaller than the second atomic ratio AR2. A peak of the second graph 220 may be greater than the second atomic ratio AR2.

As described above, in the well layer WL of the active layer AL, electron-hole pairs are combined, so that light can be emitted. An energy scale emitted may be changed according to the energy band gap of the well layer WL in which the electron-hole pairs are combined. For example, the wavelength of light emitted may be changed according to the energy band gap of the well layer WL.

The first atomic ratio AR1 may be a minimum atomic ratio for allowing the first well layer WL1 to have the first band gap BG1. The second atomic ratio AR2 may be a minimum atomic ratio for allowing the second well layer WL2 to have the second band gap BG2. The second atomic ratio AR2 may be greater than the first atomic layer AR1.

For example, the first atomic ratio AR1 may be equal to or greater than 5% and be equal to or smaller than 10%. The second atomic ratio AR2 may be equal to or greater than 10%. In one or more embodiments, the second atomic ratio AR2 may be equal to or greater than 11%. However, the present disclosure is not limited to the above-described example.

In accordance with one or more embodiments, the atomic ratio of the band-gap-determining material in the first well layer WL1 may be provided to be greater than the first atomic ratio AR1 and to be smaller than the second atomic ratio AR2, so that first light having a first wavelength is emitted.

In accordance with one or more embodiments, the atomic ratio of the band-gap-determining material in the second well layer WL2 may be provided to be greater than the second atomic ratio AR2, so that second light having a second wavelength greater than the first wavelength is emitted.

In some embodiments, the atomic ratio of the band-gap-determining material in the (1-1)th active area 112 may be provided to be greater than the second atomic ratio AR2, and the atomic ratio of the band-gap-determining material in the (1-2)th active area 114 may be provided to be smaller than the second atomic ratio AR2.

Hereinafter, a manufacturing method of the light emitting element LD in accordance with one or more embodiments of the present disclosure will be described with reference to FIGS. 6 to 13. Descriptions of portions overlapping with those described above will be omitted or will be simplified.

FIGS. 6 to 13 are cross-sectional views illustrating one or more acts of a manufacturing method of the light emitting element in accordance with one or more embodiments of the present disclosure.

Figure 6:
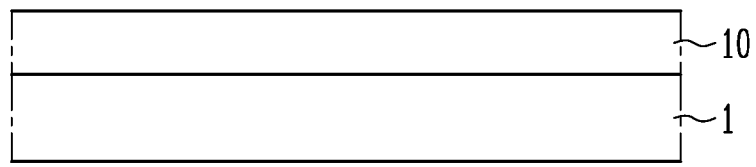
FIGS. 6 to 13 are cross-sectional views illustrating one or more acts of a manufacturing method of the light emitting element in accordance with one or more embodiments of the present disclosure.

Referring to FIG. 6, a stack substrate 1 may be prepared, and an undoped semiconductor layer 10 may be formed on the stack substrate 1.

The stack substrate 1 may be a base plate for stacking a target material. The stack substrate 1 may be a wafer for epitaxial growth of a set or predetermined material. In one or more embodiments, the stack structure 1 may be any one of a sapphire substrate, a GaAs substrate, a Ga substrate, and/or an InP substrate, but the present disclosure is not limited thereto. For example, when a set or specific material satisfies a set selectivity for manufacturing a light emitting element LD, and epitaxial growth of the set or specific material is smoothly performed, the set or specific material may be selected as a material of the stack substrate 1. The surface of the stack substrate 1 may be flat (e.g., substantially flat). The shape of the stack substrate 1 may be a polygonal shape including a rectangular shape or a circular shape, but the present disclosure is not limited thereto.

The undoped semiconductor layer 10 may be a semiconductor layer to which a dopant is not provided. In one or more embodiments, the undoped semiconductor layer 10 may include any one semiconductor material selected from among InAlGaN, GaN, AlGaN, InGaN, AlN, and InN, and a separate dopant is not provided to the undoped semiconductor layer 10. An etch rate of the undoped semiconductor layer 10 to which a dopant is not provided may be different from that of a first semiconductor SEC1.

The undoped semiconductor layer 10 may be formed through any suitable process selected from among Metal Organic Chemical Vapor Deposition (MOCVD), Molecular Beam Epitaxy (MBE), Vapor Phase Epitaxy (VPE), and Liquid Phase Epitaxy (LPE).

In one or more embodiments, a sacrificial layer may be provided between the stack substrate 1 and the undoped semiconductor layer 10. During a manufacturing process of the light emitting element LD, the sacrificial layer may allow the stack substrate 1 and the undoped semiconductor layer 10 to be spaced apart from each other. The sacrificial layer may include any one of GaAs, AlAs, and/or AlGaAs, but the present disclosure is not limited thereto.

Figure 7:
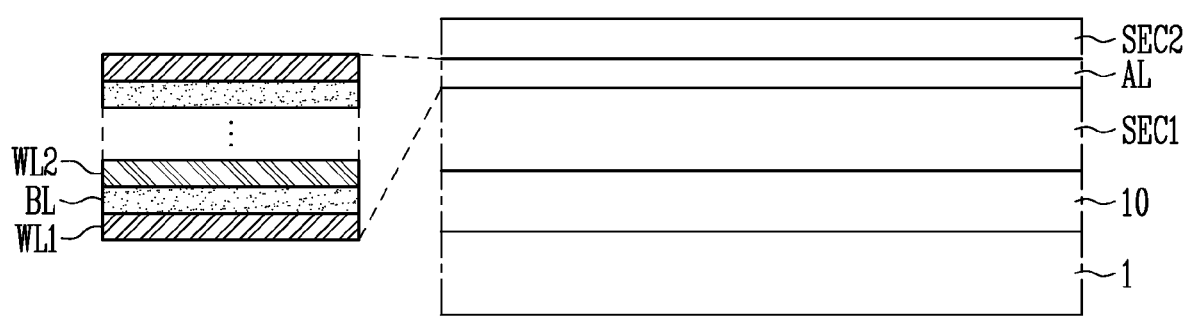

Referring to FIG. 7, the first semiconductor layer SEC1 may be formed on the undoped semiconductor layer 10, an active layer AL may be formed on the first semiconductor layer SEC1, and a second semiconductor layer SEC2 may be formed on the active layer AL. The first semiconductor layer SEC1, the active layer AL, and the second semiconductor layer SEC2 may be provided through epitaxial growth, and may be provided through any one of the processes described above in connection with the process of forming the undoped semiconductor layer 10.

In accordance with one or more embodiments, a well layer WL and a barrier layer BL may be alternately positioned on the first semiconductor layer SEC1 so as to form the active layer AL. For example, the well layer WL may be deposited on the first semiconductor layer SEC1, and the barrier layer BL may be deposited on the well layer WL. In one or more embodiments, the barrier layer BL may be deposited on the first semiconductor layer SEC1, and the well layer WL may be deposited on the barrier layer BL.

In accordance with one or more embodiments, a first well layer WL1 and a second well layer WL2 may be formed, and then another first well layer WL1 may be formed. Accordingly, the second well layer WL2 may be between the first well layers WL1. For example, a (1-1)th well layer as one of the first well layers WL1 may be provided on the first semiconductor layer SEC1, the second well layer WL2 may be provided on the (1-1)th well layer, and a (1-2)th well layer as another of the first well layers WL1 may be provided on the second well layer WL2.

As described above, the first semiconductor layer SEC1 and the second semiconductor layer SEC2 may be respectively configured as semiconductor layers of different types. As a result, the active layer AL is located between the first semiconductor layer SEC1 and the second semiconductor layer SEC2, which have different polarities, so that light can be emitted in the active layer AL when electrical information having a set or predetermined voltage (e.g., a threshold voltage) or more is provided to both ends of the light emitting element LD.

Figure 8:
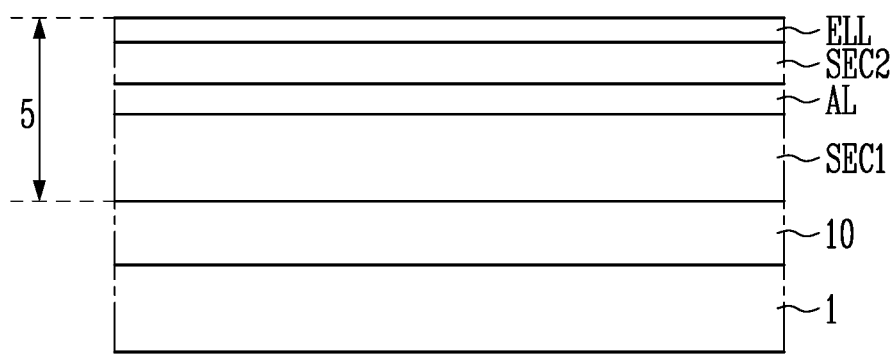

Referring to FIG. 8, an electrode layer ELL may be formed on the second semiconductor layer SEC2. The electrode layer ELL may include one of the materials described above with reference to FIGS. 1 and 2. The electrode layer ELL can minimize or reduce the loss of light output from the active layer AL and then emitted to the outside of the light emitting element LD. In one or more embodiments, the electrode layer ELL may include a transparent metal oxide so as to improve the spread of current to the second semiconductor layer SEC2.

As described above, the first semiconductor layer SEC1, the active layer AL, the second semiconductor layer SEC2, and the electrode layer ELL, which are sequentially stacked on the stack substrate 1 and the undoped semiconductor layer 10, may be configured as (e.g., may constitute) a light emitting stack structure 5.

Referring to FIG. 9, a light emitting stack pattern 7 may be formed by etching the light emitting stack structure 5 in a stacking direction. The light emitting stack pattern 7 may correspond to an area in which the light emitting stack structure 5 is etched and removed along the stacking direction, and may mean a structure in which the first semiconductor layer SEC1, the active layer AL, the second semiconductor layer SEC2, and the electrode layer ELL are sequentially arranged. The stacking direction may mean a direction perpendicular to (e.g., substantially perpendicular to or crossing) a main surface of the stack substrate 1.

In accordance with one or more embodiments, in order to form the light emitting stack pattern 7, a mask may be located on the entire surface of the light emitting stack structure 5, and patterning may be performed at an interval of nanometer scale to micrometer scale through an etching process. In one or more embodiments, the etching process for forming the light emitting stack pattern 7 may be a dry etching process. The dry etching process may be any one of Reactive Ion Etching (RIE), Reactive Ion Beam Etching (RIBE), and/or Inductively Coupled Plasma Reactive Ion Etching (ICP-RIE).

In accordance with one or more embodiments, the above-described etching process may be performed in a direction toward the first well layer WL1 adjacent to the first semiconductor layer SEC1 from the first well layer WL1 adjacent to the second semiconductor layer SEC2. For example, the etching process may be performed in a direction toward the second well layer WL2 from the second semiconductor layer SEC2. The etching process may be performed in a direction toward the first semiconductor layer SEC1 from the second semiconductor layer SEC2.

When the second well layer WL2 is adjacent to the second semiconductor layer SEC2 at a set or predetermined distance or less, it is likely that the second well layer WL2 will be damaged by the etching process.

However, in accordance with the embodiments of the present disclosure, damage to the second well layer WL2 by the etching process can be prevented or reduced. In order to improve the efficiency of the light emitting element LD, it is required for the second well layer WL2 to be adjacent to a positive semiconductor component (e.g., the second semiconductor layer SEC2), as compared with a negative semiconductor component (e.g., the first semiconductor layer SEC1). However, in some embodiments, in the manufacturing process of the light emitting element LD, an etching process may be performed in a direction toward a negative semiconductor layer from a positive semiconductor layer. As a result, when the second well layer WL2 is adjacent to the positive semiconductor layer at a set or predetermined distance or less, the second well layer WL2 may be damaged by the etching process. In addition, light having an originally intended (e.g., desired) wavelength (e.g., a wavelength having energy defined by the second band gap BG2 of the second well layer WL2) may not be normally or suitably emitted. For example, although the second well layer WL2 is configured to emit light having a first emission wavelength, light having a second emission wavelength different from the first emission wavelength may be emitted when the second well layer WL2 is damaged by the etching process.

Accordingly, when the second well layer WL2, which serves as a main light emitting layer of the active layer AL, is spaced apart from the positive semiconductor component (e.g., the second semiconductor layer SEC2) at a certain distance or more, it may be difficult to improve the light emission efficiency of the light emitting element LD. When the second well layer WL2 is adjacent to the positive semiconductor component at a certain distance or less, the second well layer WL2 may be damaged by the etching process, and therefore, the light emission reliability of the light emitting element LD may deteriorate.

However, according embodiments of the present disclosure, when the light emitting element LD includes a structural feature of the arrangement of the second well layer WL2 in accordance with the present embodiments, the light emission efficiency of the light emitting element LD can be improved, and damage to the second well layer WL2 by the etching process can be prevented or reduced. For example, the second active area 120 included in the second well layer WL2 is positioned at a set or predetermined position with respect to the first semiconductor layer SEC1 and the second semiconductor layer SEC2, so that the light emission efficiency of the light emitting element LD can be improved. Thus, the damage caused by the etching process is prevented or reduced, and accordingly, the light reliability can be improved.

Figure 10:
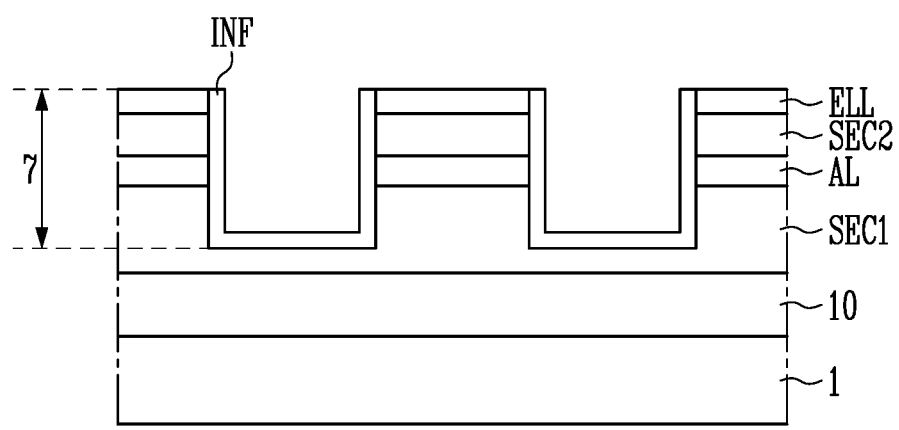

Referring to FIG. 10, an insulative film INF may be formed on the first semiconductor layer SEC1, the active layer AL, the second semiconductor layer SEC2, and the electrode layer ELL. The insulative film INF may cover the first semiconductor layer SEC1, the active layer AL, the second semiconductor layer SEC2, and the electrode layer ELL. Although in FIG. 10, the insulative film INF is not formed on the other surface of the electrode layer ELL that is not in contact with the second semiconductor layer SEC2, the present disclosure is not limited thereto. For example, the insulative film INF may be formed on the other surface of the electrode layer ELL, and afterwards may be removed through a separate process.

Figure 11:
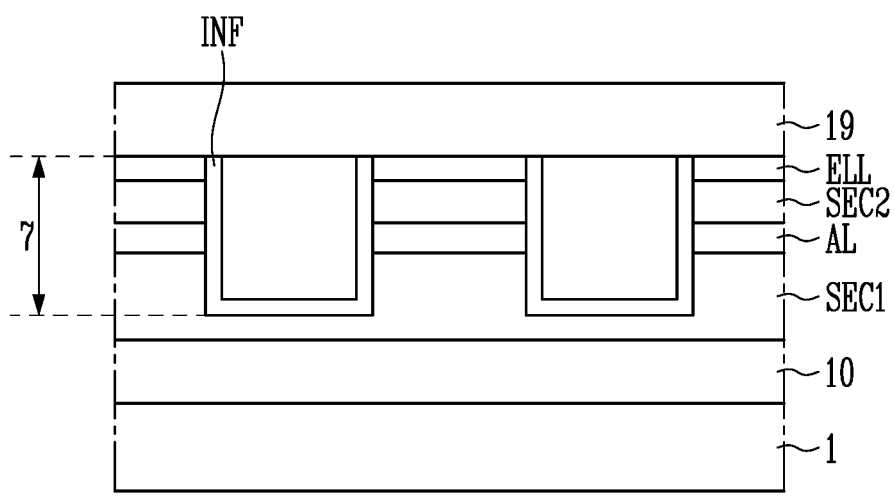

Referring to FIG. 11, a bonding layer 19 may be connected (e.g., physically coupled) onto the light emitting stack pattern 7. For example, a first metal may be coated on the light emitting stack pattern 7, and a second metal may be coated on one surface of the bonding layer 19, which is to be connected to the light emitting stack pattern 7. Bonding between the first metal and the second metal may be performed under set or predetermined temperature and pressure conditions, so that the bonding layer 19 and the light emitting stack pattern 7 are suitably bonded to each other.

Figure 12:
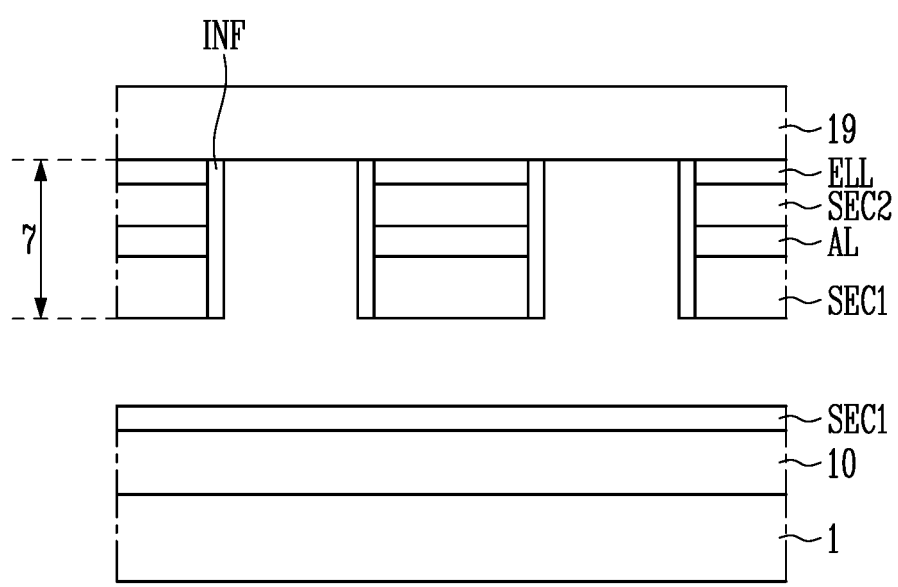

Referring to FIG. 12, the light emitting stack pattern 7 may be separated from the stack substrate 1 and the undoped semiconductor layer 10. In one or more embodiments, the light emitting stack pattern 7 may be separated through a Laser Lift-Off (LLO) process or a Chemical Lift-Off (CLO) process.

Figure 13:
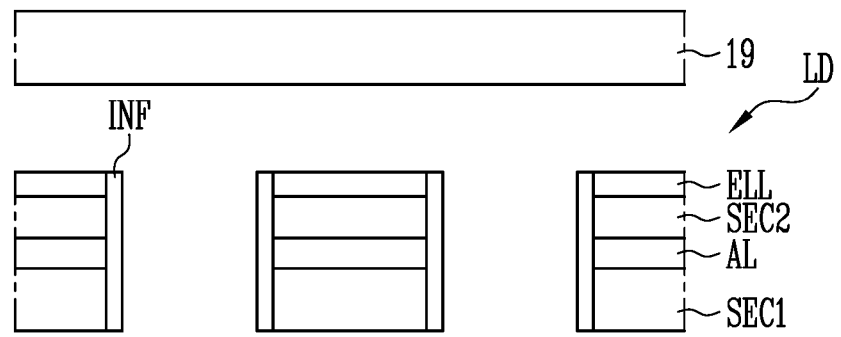

Referring to FIG. 13, the bonding layer 19 may be removed. When the bonding layer 19 is removed, the light emitting element LD described with reference to FIGS. 1 and 2 may be provided. In some embodiments, a process of removing impurities located on the surface of the provided light emitting element LD may be further performed.

Subsequently, the light emitting element LD may be dispersed in a solvent, so that an ink including the light emitting element LD and the solvent is manufactured.

Hereinafter, a display device including the light emitting element LD in accordance with one or more embodiments of the present disclosure will be described with reference to FIGS. 14 and 15.

Figure 14:
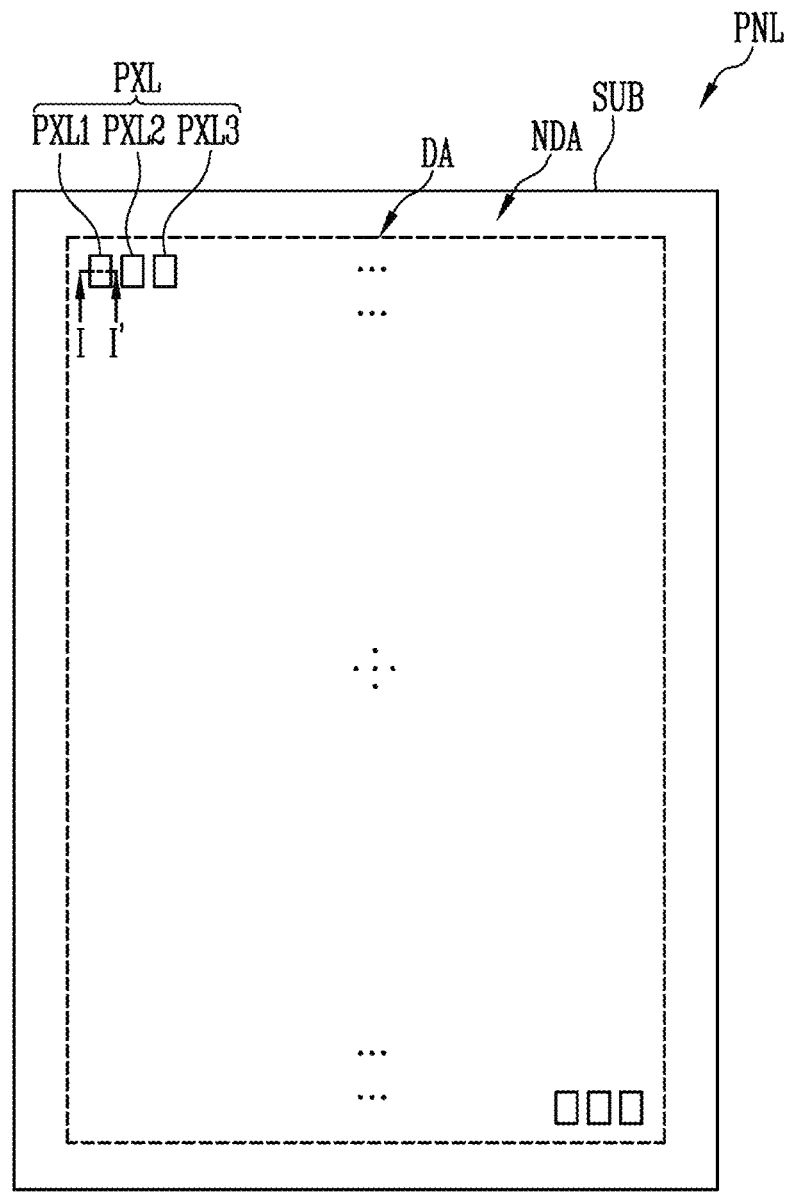
FIG. 14 is a plan view illustrating a display device including the light emitting element in accordance with one or more embodiments of the present disclosure.
Figure 14:
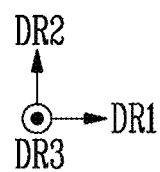

FIG. 14 is a plan view illustrating a display device including the light emitting element in accordance with one or more embodiments of the present disclosure.

In FIG. 14, a display device, for example, a display panel PNL provided in the display device, will be illustrated as an example of an electronic device which can use the light emitting element LD as a light source. In FIG. 14, a structure of the display panel PNL will be briefly illustrated with reference to a display area DA. However, in some embodiments, at least one driving circuit (e.g., at least one selected from a scan driver and a data driver), lines, and/or pads may be further included in the display panel PNL.

Referring to FIG. 14, the display panel PNL may include a substrate SUB and a pixel PXL on the substrate SUB. The pixel PXL may be provided in plurality on the substrate SUB.

The substrate SUB is used to constitute a base member of the display panel PNL, and may be a rigid or flexible substrate or a film.

The display panel PNL and the substrate SUB for forming the same may include the display area DA for displaying an image and a non-display area NDA other than the display area DA.

Pixels PXL may be arranged in the display area DA. The pixel PXL may include the light emitting element LD. Various suitable lines, pads, and/or a built-in circuit, which are connected (e.g., electrically coupled) to the pixels PXL of the display area DA, may be provided in the non-display are NDA. The pixels PXL may be regularly arranged (e.g., arranged at regular intervals) in the display area DA according to a stripe structure, a PenTile®/PENTILE® structure (PENTILE® is a registered trademark owned by Samsung Display Co., Ltd.), and/or the like. However, the arrangement structure of the pixels PXL is not limited thereto, and the pixels PXL may be arranged in the display area DA by using various suitable structures and/or methods.

In some embodiments, two or more kinds of pixels PXL emitting lights of different colors may be located in the display area DA. In one or more embodiments, the pixel PXL may include a first pixel PXL1 emitting light of a first color, a second pixel PXL2 emitting light of a second color, and a third pixel PXL3 emitting light of a third color. At least one first pixel PXL1, a least one second pixel PXL2, and at least one third pixel PXL3, which are adjacent to each other, may constitute one pixel unit capable of emitting lights of various colors. For example, each of the first to third pixels PXL1, PXL2, and PXL may be a sub-pixel emitting light of a set or predetermined color. In some embodiments, the first pixel PXL1 may be a red pixel emitting red light, the second pixel PXL2 may be a green pixel emitting green light, and the third pixel PXL3 may be a blue pixel emitting blue light. However, the present disclosure is not limited thereto.

In some embodiments, the first pixel PXL1, the second pixel PXL2, and the third pixel PXL3 respectively have, as light sources, a light emitting element LD of the first color, a light emitting element LD of the second color, and a light emitting element LD of the third color, so that the light emitting elements can respectively emit lights of the first color, the second color, and the third color. In other one or more embodiments, the first pixel PXL1, the second pixel PXL2, and the third pixel PXL3 have light emitting elements LD emitting light of the same color, and may include color conversion layers and/or color filters of different colors, which are located on the respective light emitting elements LD, to respectively emit lights of the first color, the second color, and the third color. However, the color, kind, and/or number of pixels PXL constituting each pixel unit are not particularly limited. For example, the color of light emitted by each pixel PXL may be variously suitably changed.

In some embodiments, the pixel PXL may include at least one light source driven by a set or predetermined control signal (e.g., a scan signal and a data signal) and/or a set or predetermined power source (e.g., a first power source and a second power source). In one or more embodiments, each pixel PXL may be configured as an active pixel. However, the kind, structure, and/or driving method of pixels PXL, which can be applied to the display device, are not particularly limited. For example, each pixel PXL may be configured as a pixel of a passive or active light emitting display device utilizing various suitable structures and/or driving methods.

Figure 15:
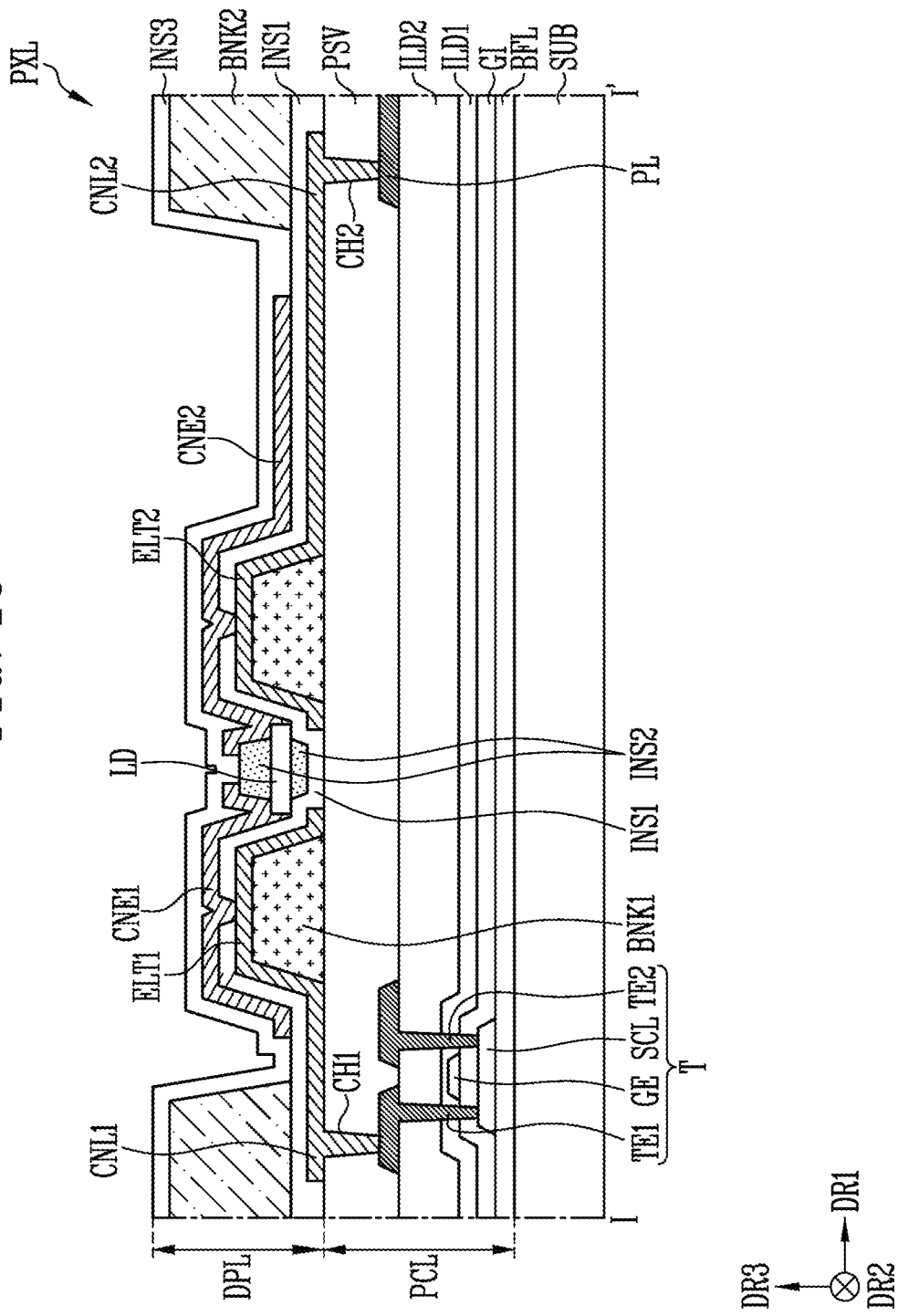
FIG. 15 is a cross-sectional view taken along line I-I' shown in FIG. 14.

FIG. 15 is a cross-sectional view taken along line I-I' shown in FIG. 14.

Referring to FIG. 15, the pixel PXL may include the substrate SUB, a pixel circuit layer PCL, and a display element layer DPL.

The substrate SUB may constitute a base surface of the pixel PXL. The substrate SUB may be a rigid or flexible substrate. In one or more embodiments, the substrate SUB may include a rigid material or a flexible material. However, the material of the substrate SUB is not limited to any specific example.

The pixel circuit layer PCL may be located on the substrate SUB. The pixel circuit layer PCL may include a buffer layer BFL, a transistor T, a gate insulating layer GI, a first interlayer insulating layer ILD1, a second interlayer insulating layer ILD2, a first contact hole CH1, a second contact hole CH2, and a protective layer PSV.

The buffer layer BFL may be located on the substrate SUB. The buffer layer BFL may prevent or reduce the diffusion of impurities from the outside. The buffer layer BFL may include at least one of silicon nitride (SiNx), silicon oxide (SiOx), silicon oxynitride (SiOxNy), or a metal oxide such as aluminum oxide (AlOx).

The transistor T may be a driving transistor. The transistor T may include a semiconductor pattern SCL, a gate electrode GE, a first transistor electrode TE1, and a second transistor electrode TE2.

The semiconductor pattern SCL may be located on the buffer layer BFL. The semiconductor pattern SCL may include at least one of poly-silicon, amorphous silicon, or an oxide semiconductor.

The semiconductor pattern SCL may include a first contact region in contact with the first transistor electrode TE1 and a second contact region in contact with the second transistor electrode TE2. The first contact region and the second contact region may correspond to a semiconductor pattern doped with an impurity. A region between the first contact region and the second contact region may be a channel region. The channel region may correspond to an intrinsic semiconductor pattern undoped with the impurity.

The gate insulating layer GI may be provided over the semiconductor pattern SCL. The gate insulating layer GI may include an inorganic material. In one or more embodiments, the gate insulating layer GI may include at least one of silicon nitride (SiNx), silicon oxide (SiOx), silicon oxynitride (SiOxNy), or aluminum oxide (AlOx). In some embodiments, the gate insulating layer GI may include an organic material.

The gate electrode GE may be located on the gate insulating layer GI. A position of the gate electrode GE may correspond to that of the channel region of the semiconductor pattern SCL. For example, the gate electrode GE may be on the channel region of the semiconductor pattern SCL with the gate insulating layer GI interposed therebetween.

The first interlayer insulating layer ILD1 may be located over the gate electrode GE. Like the gate insulating layer GI, the first interlayer insulating layer ILD1 may include at least one of silicon nitride (SiNx), silicon oxide (SiOx), silicon oxynitride (SiOxNy), or aluminum oxide (AlOx).

The first transistor electrode TE1 and the second transistor electrode TE2 may be located on the first interlayer insulating layer ILD1. The first transistor electrode TE1 may be in contact with the first contact region of the semiconductor pattern SCL while penetrating the gate insulating layer GI and the first interlayer insulating layer ILD1, and the second transistor electrode TE2 may be in contact with the second contact region of the semiconductor pattern SCL while penetrating the gate insulating layer GI and the first interlayer insulating layer ILD1. The first transistor electrode TE1 may be electrically connected (e.g., electrically coupled) to a first connection line CNL1 through a first contact hole CH1 penetrating the protective layer PSV. In one or more embodiments, the first transistor electrode TE1 may be a source electrode, and the second transistor electrode TE2 may be a drain electrode.

The second interlayer insulating layer ILD2 may be located over the first transistor electrode TE1 and the second transistor electrode TE2. Like the first interlayer insulating layer ILD1 and the gate insulating layer GI, the second interlayer insulating layer ILD2 may include an inorganic material. The inorganic material may include at least one of the materials described above as the material constituting the first interlayer insulating layer ILD1 and the gate insulating layer GI, e.g., silicon nitride (SiNx), silicon oxide (SiOx), silicon oxynitride (SiOxNy), and/or aluminum oxide (AlOx). In some embodiments, the second interlayer insulating layer ILD2 may include an organic material.

A power line PL may be on the second interlayer insulating layer ILD2. The power line PL may be electrically connected (e.g., electrically coupled) to a second connection line CNL2 through the second contact hole CH2 penetrating the protective layer PSV. The power line PL may be supplied with power, and the supplied power may be provided to the second connection line CNL2 through the second contact hole CH2.

The protective layer PSV may be located on the second interlayer insulating layer ILD2. The protective layer PSV may cover the power line PL. The protective layer PSV may be provided in a form including an organic insulating layer, an inorganic insulating layer, or the organic insulating layer positioned on the inorganic insulating layer.

The display element layer DPL may include a first bank BNK1, a first electrode ELT1, a second electrode ELT2, a first insulating layer INS1, a light emitting element LD, a first contact electrode CNE1, a second contact electrode CNE2, a second insulating layer INS2, a second bank BNK2, and a third insulating layer INS3.

The first bank BNK1 may have a shape protruding upwardly, and the first electrode ELT1 and the second electrode ELT2 may be arranged on the first bank BNK1, to form a reflective partition wall. The reflective partition wall is formed, so that the light efficiency of the light emitting element LD can be improved.

A portion of the first electrode ELT1 may be arranged on the protective layer PSV, and another portion of the first electrode ELT1 may be arranged on the first bank BNK1. The first electrode ELT1 may be a path through which electrical information on the light emitting element LD, which is applied through a first connection line CNL1, can be provided. A portion of the second electrode ELT2 may be arranged on the protective layer PSV, and another portion of the second electrode ELT2 may be arranged on the first bank BNK1. The second electrode ELT2 may be a path through which electrical information on the light emitting element LD, which is applied through the second connection line CNL2, can be provided.

The first insulating layer INS1 may be located on the protective layer PSV. The first insulating layer INS1 may include at least one of silicon nitride (SiNx), silicon oxide (SiOx), silicon oxynitride (SiOxNy), or aluminum oxide (AlOx).

At least a portion of the first insulating layer INS1 may be on the first contact electrode CNE1, the second contact electrode CNE2, the first electrode ELT1, and/or the second electrode ELT2, to stabilize electrical connection and/or to reduce external influence.

The light emitting element LD may be located on the first insulating layer INS1. In one or more embodiments, the first insulating layer INS1 may have a set or predetermined groove, at least a portion of the light emitting element LD may be in contact with an end portion formed from the groove, and another end portion of the light emitting element LD may be in contact with another end portion formed due to the groove.

The light emitting element LD may be located on the first insulating layer INS1 between the first electrode ELT1 and the second electrode ELT2. The light emitting element LD may be the light emitting element LD described above with reference to FIGS. 1 and 2.

The second insulating layer INS2 may be located on the light emitting element LD. The second insulating layer INS2 may be formed to cover a region corresponding to the active layer 12 of the light emitting element LD. The second insulating layer INS2 may include at least one of an organic material or an inorganic material.

In accordance with one or more embodiments, at least a portion of the second insulating layer INS2 may be located on a rear surface of the light emitting element LD. The second insulating layer INS2 formed on the rear surface of the light emitting element LD may fill an empty gap between the first insulating layer INS1 and the light emitting element LD in a process of forming the second insulating layer INS2 on the light emitting element LD.

The first contact electrode CNE1 and the second contact electrode CNE2 may be located on the first insulating layer INS1. The first contact electrode CNE1 and the second contact electrode CNE2 may be electrically connected (e.g., electrically coupled) respectively to the first electrode ELT1 and the second electrode ELT2 through contact hole(s) formed in the first insulating layer INS1.

In accordance with one or more embodiments, the first contact electrode CNE1 and the second contact electrode CNE2 may include a transparent conductive material. In one or more embodiments, the first contact electrode CNE1 may include at least one conductive material selected from Indium Tin Oxide (ITO), Indium Zinc Oxide (IZO), and Indium Tin Zinc Oxide (ITZO).

In accordance with one or more embodiments, an electrical signal provided through the first electrode ELT1 may be provided to the light emitting element LD through the first contact electrode CNE1. The light emitting element LD may emit light, based on the provided electrical signal. An electrical signal provided through the second electrode ELT2 may be provided to the light emitting element LD through the second contact electrode CNE2.

The second bank BNK2 may be a structure defining an emission area of the pixel PXL. The emission area may mean an area in which light is emitted from the light emitting element LD. For example, the second bank BNK2 may be positioned at a boundary area between adjacent light emitting elements LD to surround the light emitting element LD of the pixel PXL.

The third insulating layer INS3 may be arranged on the second bank BNK2, the first contact electrode CNE1, the second contact electrode CNE2, and the second insulating layer INS2. The third insulating layer INS3 may include any one of an organic material and/or an inorganic material. The third insulating layer INS3 may protect the display element layer DPL from external influence.

The arrangement relationship of the light emitting element LD, the electrodes, and/or the like is not limited to the embodiments described with reference to FIG. 15, and arrangement relationships in accordance with various suitable modifiable embodiments may be implemented.

In accordance with the present disclosure, there can be provided a light emitting element, a manufacturing method of a light emitting element, and a display device including a light emitting element, which can prevent or reduce the distortion of light information emitted from the light emitting element, thereby improving the reliability of the light information.

Also, in accordance with the present disclosure, there can be provided a light emitting element, a manufacturing method of a light emitting element, and a display device including a light emitting element, which can reduce influence on an active area of the light emitting element, while an etching process is performed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims and their equivalents.

What is claimed is:

1. A light emitting element comprising:
a first semiconductor layer comprising an N-type semiconductor;
a second semiconductor layer comprising a P-type semiconductor; and
an active layer between the first semiconductor layer and the second semiconductor layer, the active layer comprising a first active area comprising a first well layer, and a second active area comprising a second well layer,
wherein the first well layer has a first band gap, and
the second well layer has a second band gap smaller than the first band gap,
wherein at least a portion of the first active area is between the second active area and the second semiconductor layer,
wherein the second active area is spaced apart from the first semiconductor layer at a first distance, and is spaced apart from the second semiconductor layer at a second distance, the second distance being smaller than the first distance,
wherein the second distance is equal to or greater than 0.1 times of a distance between the first semiconductor layer and the second semiconductor layer,
wherein the first distance is 0.2 times to 0.35 times the height of the active layer and the second distance is 0.2 times to 0.25 times the height of the active layer,
wherein the active layer comprises band-gap-determining material,
wherein an atomic ratio of the band-gap-determining material in the first active area is equal to or greater than a first atomic ratio,
wherein an atomic ratio of the band-gap-determining material in the second active area is equal to or greater than a second atomic ratio, the second atomic ratio being greater than the first atomic ratio,
wherein the first active area comprises a (1-1)th active area and a (1-2)th active area,
wherein the (1-1)th active area is between the first semiconductor layer and the second active area,
wherein the (1-2)th active area is between the second semiconductor layer and the second active area, and
wherein the (1-1)th active is directly adjacent to the first semiconductor layer and the (1-2)th active are is directly adjacent to the second semiconductor layer.

2. The light emitting element of claim 1, wherein light having a first wavelength is to be emitted in the first active area, and
light having a second wavelength greater than the first wavelength is to be emitted in the second active area.

3. The light emitting element of claim 1, wherein the second distance is 0.2 times to 0.25 times of the distance between the first semiconductor layer and the second semiconductor layer.

4. The light emitting element of claim 3, wherein the first distance is equal to or greater than 0.2 times of the distance between the first semiconductor layer and the second semiconductor layer.

5. The light emitting element of claim 1, wherein a ratio of the second distance to the first distance is 0.55 to 1.

6. The light emitting element of claim 1, wherein a ratio of the second distance to the first distance is 0.8 to 1.25.

7. The light emitting element of claim 1, wherein the second atomic ratio is equal to or greater than 10%.

8. The light emitting element of claim 7, wherein the band-gap-determining material comprises indium (In).

9. A method of manufacturing a light emitting element, the method comprising:
providing, on a stack substrate, a first semiconductor layer comprising an N-type semiconductor;
providing an active layer on the first semiconductor layer; and
providing, on the active layer, a second semiconductor layer comprising a P-type semiconductor,
wherein the providing of the active layer comprises:
providing a first well layer; and
providing a second well layer, at least a portion of the first well layer being between the second well layer and the second semiconductor layer,
wherein an energy band gap of the second well layer is smaller than an energy band gap of the first well layer,
wherein the active layer comprises a first active area comprising the first well layer, and a second active area comprising the second well layer,
wherein the second active area is spaced apart from the first semiconductor layer at a first distance, and is spaced apart from the second semiconductor layer at a second distance, the second distance being smaller than the first distance,
wherein the second distance is equal to or greater than 0.1 times of a distance between the first semiconductor layer and the second semiconductor layer,
wherein the first distance is 0.2 times to 0.35 times the height of the active layer and the second distance is 0.2 times to 0.25 times the height of the active layer
wherein the active layer comprises band-gap-determining material,
wherein an atomic ratio of the band-gap-determining material in the first active area is equal to or greater than a first atomic ratio,
wherein an atomic ratio of the band-gap-determining material in the second active area is equal to or greater than a second atomic ratio, the second atomic ratio being greater than the first atomic ratio,
wherein the first active area comprises a (1-1)th active area and a (1-2)th active area,
wherein the (1-1)th active area is between the first semiconductor layer and the second active area,
wherein the (1-2)th active area is between the second semiconductor layer and the second active area, and
wherein the (1-1)th active is directly adjacent to the first semiconductor layer and the (1-2)th active are is directly adjacent to the second semiconductor layer.

10. The method of claim 9, wherein light having a first wavelength is to be emitted in the first active area, and
light having a second wavelength greater than the first wavelength is to be emitted in the second active area.

11. The method of claim 9, further comprising etching the first semiconductor layer, the active layer, and the second semiconductor layer,
wherein the providing of the first well layer further comprises:
providing a (1-1)th well layer on the first semiconductor layer; and
providing a (1-2)th well layer on the second well layer,
wherein the second well layer is between the (1-1)th well layer and the (1-2)th well layer, and
wherein the etching is performed after the providing of the (1-2)th well layer.

12. The method of claim 11, wherein the etching is performed in a direction toward the (1-1)th well layer from the (1-2)th well layer.

13. The method of claim 1, wherein the second distance is 0.2 times to 0.25 times of the distance between the first semiconductor layer and the second semiconductor layer.

14. The method of claim 13, wherein the first distance is equal to or greater than 0.2 times of the distance between the first semiconductor layer and the second semiconductor layer.

15. The method of claim 9, wherein the active layer comprises band-gap-determining material, and
wherein an atomic ratio of the band-gap-determining material in the first active area is smaller than an atomic ratio of the band-gap-determining material in the second active area.

16. An electronic device comprising the light emitting element according to claim 1.

* * * * *